United States Patent
Ishihama

(10) Patent No.: US 11,894,652 B2
(45) Date of Patent: Feb. 6, 2024

(54) PASSIVE Q SWITCHING LASER DEVICE, CONTROL METHOD, AND LASER PROCESSING DEVICE

(71) Applicant: SONY GROUP CORPORATION, Tokyo (JP)

(72) Inventor: Yasuyuki Ishihama, Tokyo (JP)

(73) Assignee: SONY GROUP CORPORATION, Tokyo (JP)

(*) Notice: Subject to any disclaimer, the term of this patent is extended or adjusted under 35 U.S.C. 154(b) by 34 days.

(21) Appl. No.: 17/610,408

(22) PCT Filed: Mar. 31, 2020

(86) PCT No.: PCT/JP2020/014803
§ 371 (c)(1),
(2) Date: Nov. 10, 2021

(87) PCT Pub. No.: WO2020/235222
PCT Pub. Date: Nov. 26, 2020

(65) Prior Publication Data
US 2022/0209489 A1  Jun. 30, 2022

(30) Foreign Application Priority Data
May 21, 2019 (JP) ................. 2019-095324

(51) Int. Cl.
*H01S 3/113* (2006.01)
*H01S 3/094* (2006.01)
(Continued)

(52) U.S. Cl.
CPC ............ *H01S 3/113* (2013.01); *H01S 3/0941* (2013.01); *H01S 3/102* (2013.01); *H01S 5/0427* (2013.01);
(Continued)

(58) Field of Classification Search
CPC .. H01S 3/094076; H01S 3/0941; H01S 3/113; H01S 3/1305; H01S 3/1312; B23K 26/082
See application file for complete search history.

(56) References Cited

U.S. PATENT DOCUMENTS

2003/0138005 A1   7/2003 Kan et al.
2005/0107773 A1*  5/2005 Bergt .................. A61F 9/00836
                                                            606/4
(Continued)

FOREIGN PATENT DOCUMENTS

JP    2001-185794    7/2001
JP    2001-358394    12/2001
(Continued)

OTHER PUBLICATIONS

International Search Report prepared by the Japan Patent Office dated Jun. 11, 2020, for International Application No. PCT/JP2020/014803, 3 pgs.

*Primary Examiner* — Michael Carter
(74) *Attorney, Agent, or Firm* — SHERIDAN ROSS P.C.

(57) ABSTRACT

A passive Q switching laser device according to an embodiment of the present technology includes: a passive Q switching laser; a signal source; a modulation unit; and a power source unit. The passive Q switching laser includes an excitation light source that emits excitation light, and a resonator that is excited by the excitation light to emit oscillation light. The signal source outputs a drive signal for driving the excitation light source. The modulation unit modulates, on the basis of emission timing at which the oscillation light is emitted from the passive Q switching laser, the drive signal output from the signal source. The power source unit drives, on the basis of the drive signal
(Continued)

modulated by the modulation unit, the excitation light source to emit the excitation light.

20 Claims, 9 Drawing Sheets

(51) Int. Cl.
*H01S 3/0941* (2006.01)
*H01S 3/102* (2006.01)
*H01S 5/042* (2006.01)
*H01S 3/13* (2006.01)
*B23K 26/082* (2014.01)

(52) U.S. Cl.
CPC ....... *B23K 26/082* (2015.10); *H01S 3/094076* (2013.01); *H01S 3/1305* (2013.01); *H01S 3/1307* (2013.01)

(56) References Cited

U.S. PATENT DOCUMENTS

| | | | |
|---|---|---|---|
| 2005/0270631 A1* | 12/2005 | Johnson | H01S 3/117 |
| | | | 359/305 |
| 2009/0135858 A1 | 5/2009 | Kyusho | |
| 2010/0197116 A1* | 8/2010 | Shah | H01L 21/268 |
| | | | 219/121.68 |
| 2011/0240619 A1 | 10/2011 | Hayashi | |

FOREIGN PATENT DOCUMENTS

| | | |
|---|---|---|
| JP | 2003-198019 | 7/2003 |
| JP | 2009-130143 | 6/2009 |
| JP | 2010-228007 | 10/2010 |
| JP | 2012-141523 | 7/2012 |
| JP | 2012-142523 | 7/2012 |
| JP | 2015-145926 | 8/2015 |
| JP | 2017-017196 | 1/2017 |
| WO | WO 2007/064298 | 6/2007 |

* cited by examiner

| Input | | | Output |
|---|---|---|---|
| Preset input | Clock input | Data input | |
| L | X | X | H |
| H | ↑ | H | H |
| H | ↑ | L | L |
| H | L | X | Hold previous state |

PASSIVE Q SWITCHING LASER DEVICE, CONTROL METHOD, AND LASER PROCESSING DEVICE

CROSS REFERENCE TO RELATED APPLICATIONS

This application is a national stage application under 35 U.S.C. 371 and claims the benefit of PCT Application No. PCT/JP2020/014803 having an international filing date of 31 Mar. 2020, which designated the United States, which PCT application claimed the benefit of Japanese Patent Application No. 2019-095324 filed 21 May 2019, the entire disclosures of each of which are incorporated herein by reference.

TECHNICAL FIELD

The present technology relates to a passive Q switching laser device, a control method, and a laser processing device.

BACKGROUND ART

In a passive Q switching laser device described in Patent Literature 1, the timing of an optical pulse output from an excitation source is monitored. Whether or not the monitored timing of the output optical pulse is delayed for periodic reference clocks is determined. A current pulse is input to the excitation source to synchronize the reference clock and the output timing with each other on the basis of the determination result. As a result, it is possible to synchronize the frequency and output timing of the optical pulse with each other, and it is intended to automatically perform adjustment of the frequency of the optical pulse (paragraphs [0019] and [0037], FIG. 1, FIG. 3, and the like of Patent Literature 1).

CITATION LIST

Patent Literature

Patent Literature 1: Japanese Patent Application Laid-open No. 2012-141523

DISCLOSURE OF INVENTION

Technical Problem

As described above, there is a need for a technology capable of controlling emission of a laser beam with high accuracy with respect to a passive Q switching laser device.

In view of the circumstances as described above, it is an object of the present technology to provide a passive Q switching laser device, a control method, and a laser processing device that are capable of controlling emission of a laser beam with high accuracy.

Solution to Problem

In order to achieve the above-mentioned object, a passive Q switching laser device according to an embodiment of the present technology includes: a passive Q switching laser; a signal source; a modulation unit; and a power source unit.

The passive Q switching laser includes an excitation light source that emits excitation light, and a resonator that is excited by the excitation light to emit oscillation light.

The signal source outputs a drive signal for driving the excitation light source.

The modulation unit modulates, on the basis of emission timing at which the oscillation light has been emitted from the passive Q switching laser, the drive signal output from the signal source.

The power source unit drives, on the basis of the drive signal modulated by the modulation unit, the excitation light source to emit the excitation light.

In this passive Q switching laser device, a drive signal for driving the excitation light source is modulated on the basis of emission timing at which the oscillation light is emitted from the passive Q switching laser. As a result, it is possible to control emission of a laser beam with high accuracy.

The modulation unit may modulate the drive signal to stop emission of the excitation light in accordance with the emission timing.

The modulation unit may include a detection unit that detects emission of the oscillation light and outputs a detection signal and a modulator circuit that modulates the drive signal upon receiving the detection signal output from the detection unit.

The detection unit may include a splitting element that partially splits the oscillation light, and a photodetector that receives part of the oscillation light split by the splitting element, converts the received part into a signal, and outputs the converted signal as the detection signal.

The drive signal may be a pulse signal. In this case, the power source unit may cause the excitation light source to emit the excitation light while the pulse signal input to the power source unit is at an on-level. In this case, the modulation unit may modulate a time period of the on-level of the pulse signal output from the signal source.

The modulation unit may set the pulse signal output from the signal source in accordance with the emission timing to an off-level.

The signal source may emit the pulse signal in which on-timing has been set on the basis of target timing at which the oscillation light is to be emitted.

The signal source may output the pulse signal having pulses corresponding to the desired target number of times of emission of the oscillation light.

The modulation unit may include a detection unit that detects emission of the oscillation light and outputs a detection signal, and a modulator circuit that modulates the pulse signal upon receiving the detection signal output from the detection unit. In this case, a pause time of the pulse included in the pulse signal may be set to be at least equal to or larger than the minimum pause time.

The pause time of the pulse may be set on the basis of a time difference between timing at which the detection signal is output from the detection unit and timing at which the excitation light is stopped.

The excitation light source may be a laser diode.

The detection unit may be a photodiode.

A control method according to an embodiment of the present technology is a control method for a passive Q switching laser including an excitation light source that emits excitation light and a resonator that is excited by the excitation light to emit oscillation light, including: outputting a drive signal for driving the excitation light source of the passive Q switching laser.

On the basis of emission timing at which the oscillation light has been emitted from the resonator of the passive Q switching laser, the drive signal output from the signal source is modulated.

On the basis of the modulated drive signal, the excitation light source is driven to emit the excitation light.

A laser processing device according to an embodiment of the present technology includes: the passive Q switching laser; the signal source; the modulation unit; the power source unit; and an emission mechanism.

The emission mechanism is a mechanism for emitting, toward a workpiece, the oscillation light emitted from the resonator of the passive Q switching laser.

The emission mechanism may include at least one of an optical scanning mechanism that performs scanning with the oscillation light and a transport mechanism that transports the workpiece.

BRIEF DESCRIPTION OF DRAWINGS

FIG. 7 is a diagram showing an operation example of the flip-flop.

MODE(S) FOR CARRYING OUT THE INVENTION

Embodiments according to the present technology will now be described below with reference to the drawings.

[Passive Q Switching Laser Device]

Figure 1:
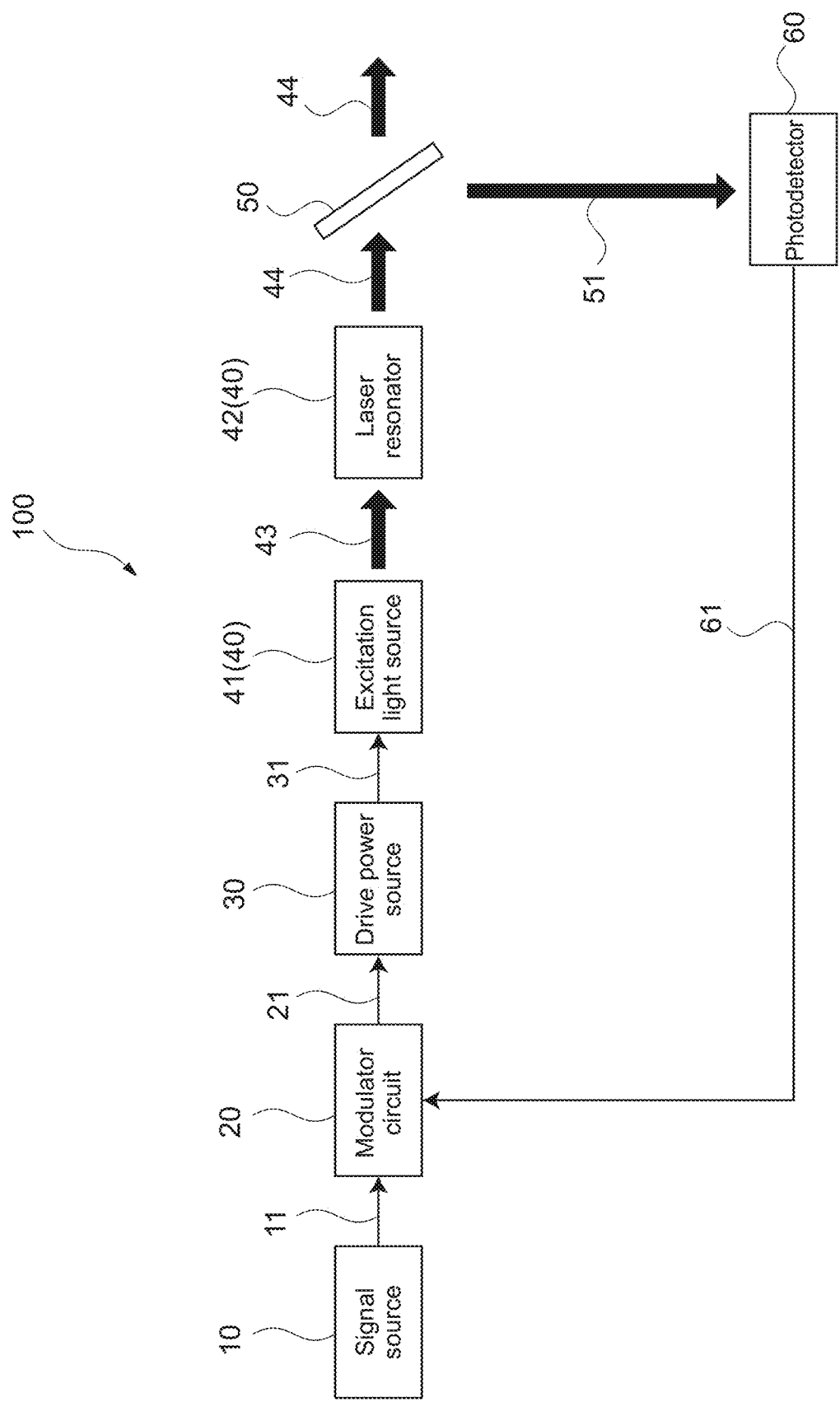
FIG. 1 is a diagram schematically showing a functional configuration example of a passive Q switching laser device.

FIG. 1 is a block diagram showing a configuration example of a passive Q switching laser device according to the present technology.

A passive Q switching laser device 100 includes a signal source 10, a modulator circuit 20, a drive power source 30, a passive Q switching laser 40, a beam sampler 50, and a photodetector 60.

The passive Q switching laser 40 includes an excitation light source 41 and a laser resonator 42.

The excitation light source 41 emits excitation light 43 toward the laser resonator 42. In this embodiment, as the excitation light source 41, a laser diode is used. This makes it possible to easily control switching of on and off of emission of the excitation light 43. Further, it is possible to stabilize the light amount of the excitation light 43 emitted to the laser resonator 42.

The specific configuration of the laser diode is not limited, and an arbitrary material such as a crystalline material and an amorphous material may be used. Note that a light source other than the laser diode may be used.

The laser resonator 42 is excited by the excitation light 43 emitted from the excitation light source 41 to emit oscillation light. For example, the laser resonator 42 includes a laser medium, a saturable absorber, a reflecting mirror, and an emitting mirror (all not shown).

The laser medium is excited by the excitation light 43. Light is emitted from the laser medium to the saturable absorber when the energy level transitions due to excitation. As the laser medium, for example, ND:YAG or ND:YLF is used.

The saturable absorber is a member in which the light absorptivity is reduced when the light absorption is saturated. In this embodiment, the light emitted from the laser medium is absorbed and the electron density of the excitation level increases. The saturable absorber becomes transparent in the case where the excitation level is satisfied, and thus, a laser pulse oscillation light 44 is emitted. Further, the saturable absorber functions as a passive Q switch in the passive Q switching laser 40.

The reflecting mirror and the emitting mirror are mirrors having different transmittances and reflectances. Further, the reflecting mirror and the emitting mirror are disposed to face each other with the laser medium and the saturable absorber sandwiched therebetween. The reflecting mirror and the emitting mirror produce a population inversion and the light intensity in the laser resonator 42 is amplified. Further, the laser pulse oscillation light 44 is transmitted through the emitting mirror, and thus, can be emitted to the outside of the laser resonator 42.

The signal source 10 outputs a pulse signal 11 as a drive signal for driving the excitation light source 41. In this embodiment, the pulse signal 11 in which on-timing has been set is output on the basis of target timing at which oscillation light is to be emitted from the passive Q switching laser 40. The target timing is target timing at which a laser beam is to be emitted from the passive Q switching laser device 100.

It can be said that the pulse signal 11 is also a drive timing signal for specifying the drive timing of the excitation light source 41.

The modulator circuit 20 modulates the pulse signal 11 output from the signal source 10. In this embodiment, the pulse signal 11 is modulated on the basis of the emission timing at which the laser pulse oscillation light 44 has been emitted. A modulation pulse signal 21 that is a modulated pulse signal is output to the drive power source 30.

The drive power source 30 drives, on the basis of the modulation pulse signal 21 modulated by the modulator circuit 20, the excitation light source 41 to emit the excitation light 43. In this embodiment, an excitation-light-source drive signal 31 is output to the excitation light source 41 at the timing synchronized with the modulation pulse signal 21.

The excitation-light-source drive signal 31 is a pulse signal synchronized with the modulation pulse signal 21. That is, the excitation-light-source drive signal 31 is a signal that transitions to the on-level in synchronization with the timing at which the modulation pulse signal 21 transitions to the on-level, and transitions to the off-level in synchronization with the timing at which the modulation pulse signal 21 transitions to the off-level.

In this embodiment, while the excitation-light-source drive signal 31 output from the drive power source 30 is at the on-level, the excitation light 43 is emitted from the excitation light source 41. Therefore, while the modulation pulse signal 21 input to the drive power source 30 is at the on-level, the excitation light 43 is emitted from the excitation light source 41.

In this embodiment, the time period of the on-level of the pulse signal 11 output from the signal source 10 is modulated by the modulator circuit 20 shown in FIG. 1. Therefore, the time period of emission of the excitation light 43 emitted from the excitation light source 41 is controlled in accordance with the modulation of the pulse signal 11 by the modulator circuit 20.

The beam sampler 50 partially splits the laser pulse oscillation light 44 emitted from the laser resonator 42. In this embodiment, the laser pulse oscillation light 44 is partially split by reflecting part of the laser pulse oscillation light 44. A laser pulse reflected light 51 that is part of the split laser pulse oscillation light 44 is emitted to the photodetector 60.

The laser pulse oscillation light 44 that is transmitted through the beam sampler 50 is a laser beam to be output from the passive Q switching laser device 100. That is, the laser pulse oscillation light 44 that is transmitted through the beam sampler 50 is made available as a laser beam in the passive Q switching laser device 100.

The photodetector 60 is capable of receiving the laser pulse reflected light 51 obtained by the splitting by the beam sampler 50 and of converting the received light into an electrical signal. Further, the photodetector 60 outputs a laser pulse detection signal 61 converted into an electrical signal to the modulator circuit 20. In this embodiment, as the photodetector 60, a photodiode is used. It goes without saying that the present technology is not limited thereto and an arbitrary element may be used.

In this embodiment, a detection unit that detects emission of oscillation light and outputs a detection signal is realized by the beam sampler 50 and the photodetector 60. The beam sampler 50 functions as a splitting element that partially splits oscillation light. As the splitting element, another arbitrary element different from the beam sampler 50 may be used.

Further, the photodetector 60 corresponds to a photodetector that receives part of the oscillation light split by the splitting element, converts the received part into a signal, and outputs the converted signal as the detection signal. The laser pulse detection signal 61 output from the photodetector 60 to the modulator circuit 20 corresponds to the detection signal.

Note that in this embodiment, the modulator circuit 20 corresponds to a modulation unit that modulates, on the basis of emission timing at which the oscillation light has been emitted from the passive Q switching laser, the drive signal output from the signal source. Further, the drive power source 30 corresponds to a power source unit that drives, on the basis of the drive signal modulated by the modulation unit, the excitation light source to emit the excitation light.

Figure 2:
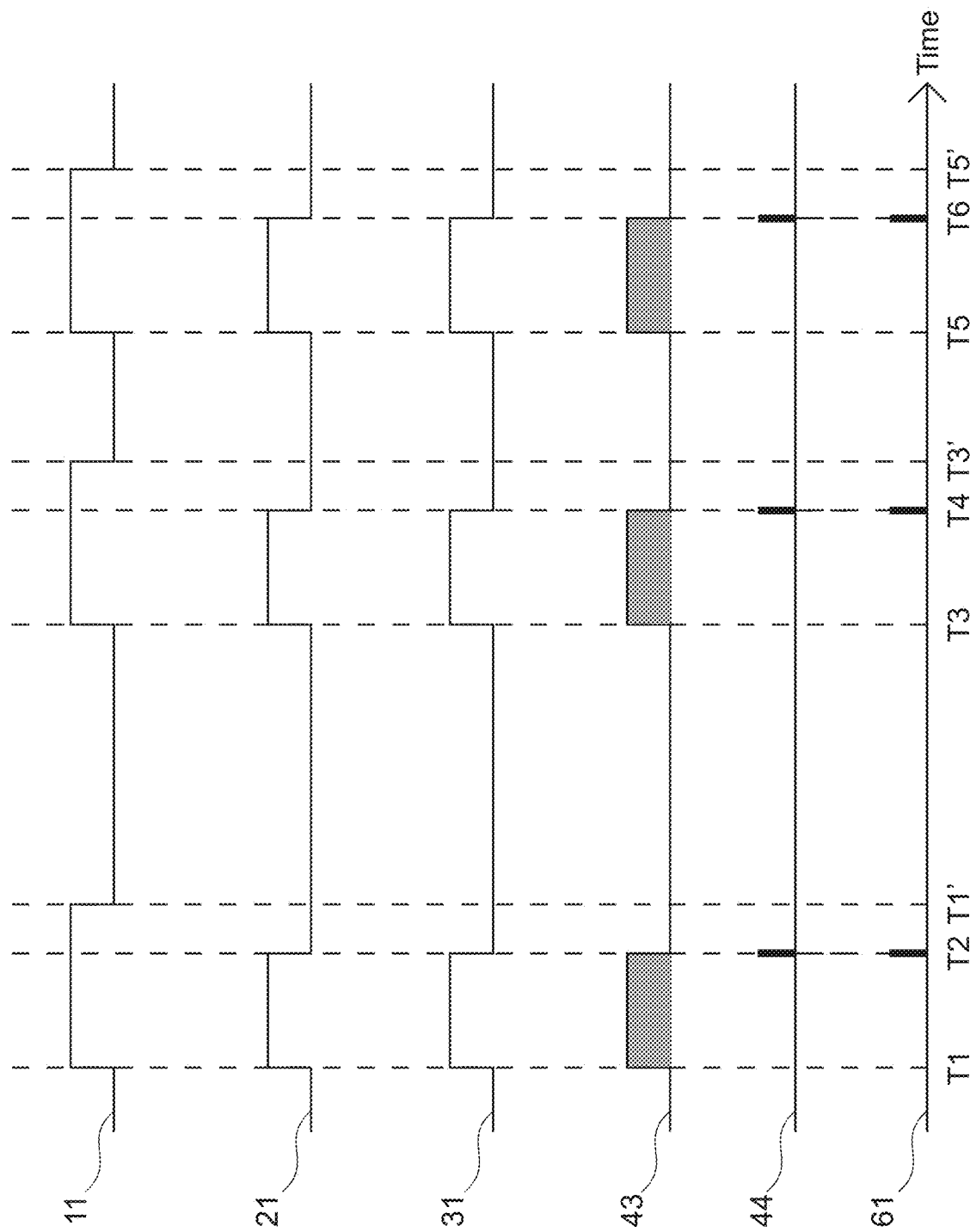
FIG. 2 is a diagram showing timing of the signals output from the respective units shown in FIG. 1, excitation light, and laser pulse oscillation light.

FIG. 2 is a schematic timing chart showing the signals output from the respective units shown in FIG. 1, the excitation light 43, and the laser pulse oscillation light 44.

Hereinafter, the states in which the voltages of the respective pulse signals are high are described as valid, true, 1, H (High), and the like, which represent the on-level. Further, the states in which the voltages are low are described as invalid, false, 0, L (Low), and the like, which represent the off-level. Note that such setting that the low-voltage state represents the on-level and the high-voltage state represents the off-level may be adopted.

Figure 3:
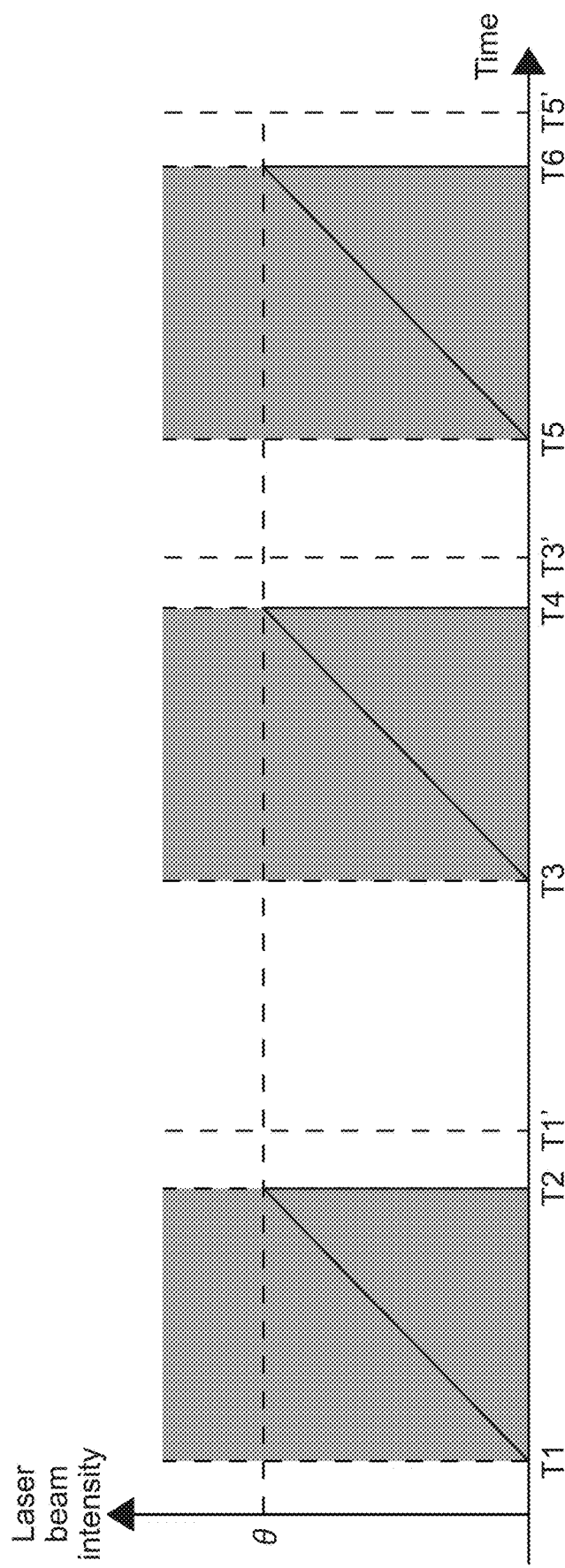
FIG. 3 is a graph showing light intensity in a laser resonator.

FIG. 3 is a graph showing light intensity in the laser resonator 42. The vertical axis represents the intensity of a laser beam in the laser resonator 42. The horizontal axis represents the elapsed time.

As shown in FIG. 2, the pulse signal 11 that transitions to the on-level (rises) at a time T1 is output from the signal source. Although described above, the time T1 at which the pulse signal 11 transitions to the on-level is set on the basis of the target timing at which the laser pulse oscillation light 44 is emitted.

Specifically, the time obtained by back calculating, from the target timing, the time period from when the excitation is started to when the intensity of a laser beam in the laser resonator 42 exceeds a threshold value θ (see FIG. 3) and the laser pulse oscillation light 44 is emitted is set as the time T1.

As shown in FIG. 2, the modulation pulse signal 21 and the excitation-light-source drive signal 31 are output in synchronization with the pulse signal 11 output from the signal source 10. The modulation pulse signal 21 and the excitation-light-source drive signal 31 are each a pulse signal that transitions to the on-level at the time T1.

The excitation light source 41 is driven on the basis of the modulation pulse signal 21 and the excitation-light-source drive signal 31. As a result, as shown in FIG. 3, excitation is started from the time T1.

At a time T2, when the intensity of a laser beam in the laser resonator 42 exceeds the threshold value 19, the laser pulse oscillation light 44 is emitted from the laser resonator 42. Therefore, in this embodiment, the time T2 is the emission timing of the laser pulse oscillation light 44.

The laser pulse oscillation light 44 emitted at the time T2 is partially split by the beam sampler 50 and the obtained part is emitted to the photodetector 60. The laser pulse reflected light 51 emitted from the beam sampler 50 is detected by the photodetector 60, and the laser pulse detection signal 61 is output to the modulator circuit 20.

In this embodiment, the laser pulse oscillation light 44 is emitted one time to the respective pules of the modulation pulse signal 21. That is, a pulse signal having pulses corresponding to the desired target number of times of emission of the laser pulse oscillation light 44.

The modulator circuit 20 receives the laser pulse detection signal 61 output from the photodetector 60 and modulates the pulse signal 11 output from the signal source 10. In this embodiment, the modulator circuit 20 modulates the pulse signal such that emission of the excitation light 43 is stopped in accordance with the mission timing of the time T2.

The modulator circuit 20 modulates the time period of the on-level of the pulse signal 11. Specifically, the pulse signal 11 output from the signal source 10 transitions to the off-level in accordance with the emission timing of the time T2.

As shown in FIG. 3, the excitation is stopped at the time T2. Therefore, when the laser pulse oscillation light 44 is emitted, the excitation of the laser resonator 42 is stopped in accordance with the emission timing. Therefore, the excitation can be stopped at timing before a time T1' at which the pulse signal 11 output from the signal source 10 falls.

As a result, the time period from the time T1 to T2, which is the time period from when the modulation pulse signal 21 enters the valid state from the invalid state to when the laser pulse oscillation light 44 is emitted, is constant regardless of the time period from the time T1 to T1' of the on-level of the pulse signal 11.

A similar operation is executed from a time T3 set on the basis of the next target timing and also from a time T5, and the laser pulse oscillation light 44 is emitted at the target timing.

Note that in this embodiment, the pulse width of each pulse signal may be arbitrarily set. That is, the length from the time T1 to T1', the length from the time T2 to T2', and the length from the time T3 to T3' may set to differ.

Figure 4:
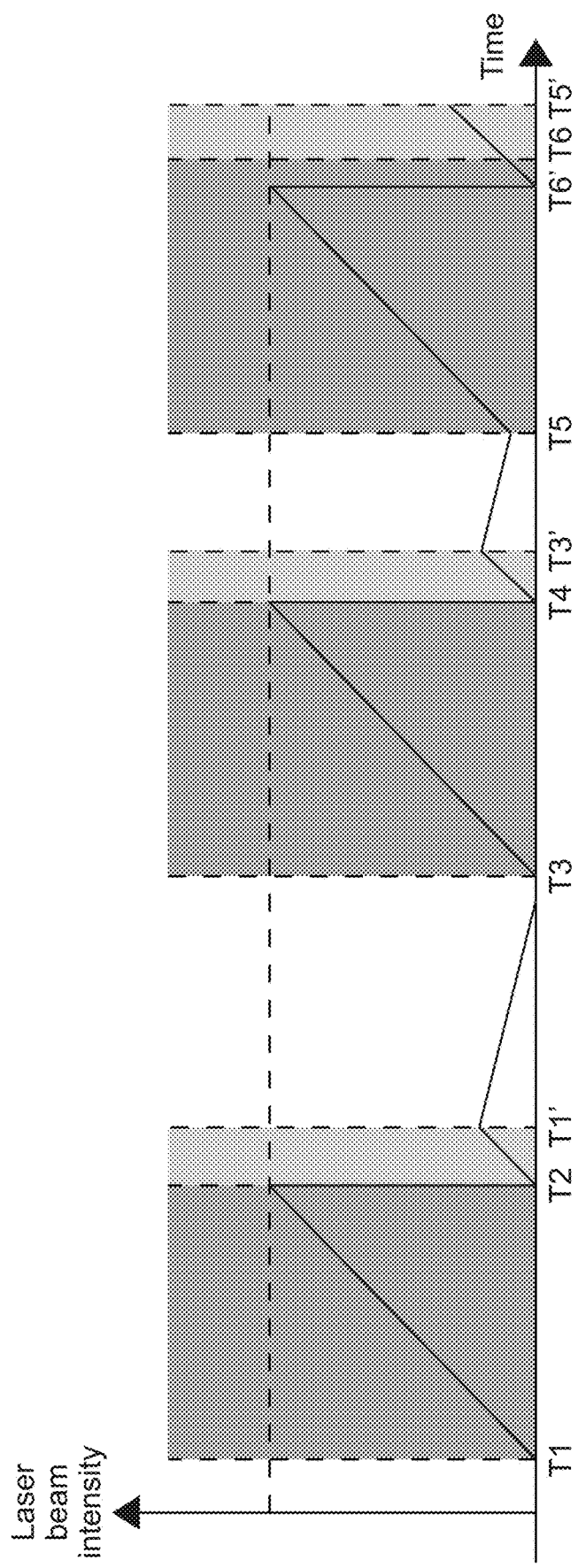
FIG. 4 is a schematic diagram for describing an emission operation of a passive Q switching laser device according to a Comparative Example.

FIG. 4 is a schematic diagram for describing an emission operation of the passive Q switching laser device 100 according to a Comparative Example. This passive Q switching laser device 100 does not include the modulator circuit 20, and the drive power source 30 operates on the basis of the pulse signal 11 of the signal source 10.

In FIG. 4, the laser resonator 42 is excited by the excitation light 43 from the time T1 to T1', and the laser pulse oscillation light 44 is emitted at the time T2. In this case, excess excitation occurs because the laser resonator 42 is excited by the excitation light 43 from the time T2 to T1'. The excess excitation disappears in accordance with the elapsed time. For example, the time period from the time T1' to T3 is enough for the excess excitation to disappear.

As shown in FIG. 4, in the case where the excess excitation disappears, the time period from the time T3 to T4 is equal to the time period from the time T1 to T2. That is, no deviation of the emission timing of the laser pulse oscillation light 44 occurs. However, in the case of a short time period in which the excess excitation does not disappear, such as the time period from T3' to T5, deviation of the emission timing of the laser pulse oscillation light 44 occurs.

For example, at the time T5, the intensity of a laser beam in the laser resonator 42 reaches the threshold value θ earlier by the time period corresponding to the excess excitation. That is, a time T6' at which the laser pulse oscillation light 44 is emitted is earlier than a time T6 that is the original emission timing.

Meanwhile, in this embodiment, emission of the excitation light 43 is stopped in accordance with emission of the laser pulse oscillation light 44. That is, it is possible to prevent the excess excitation from affecting the next emission of the laser pulse oscillation light 44. As a result, it is possible to control emission of a laser beam with high accuracy.

Figure 5:
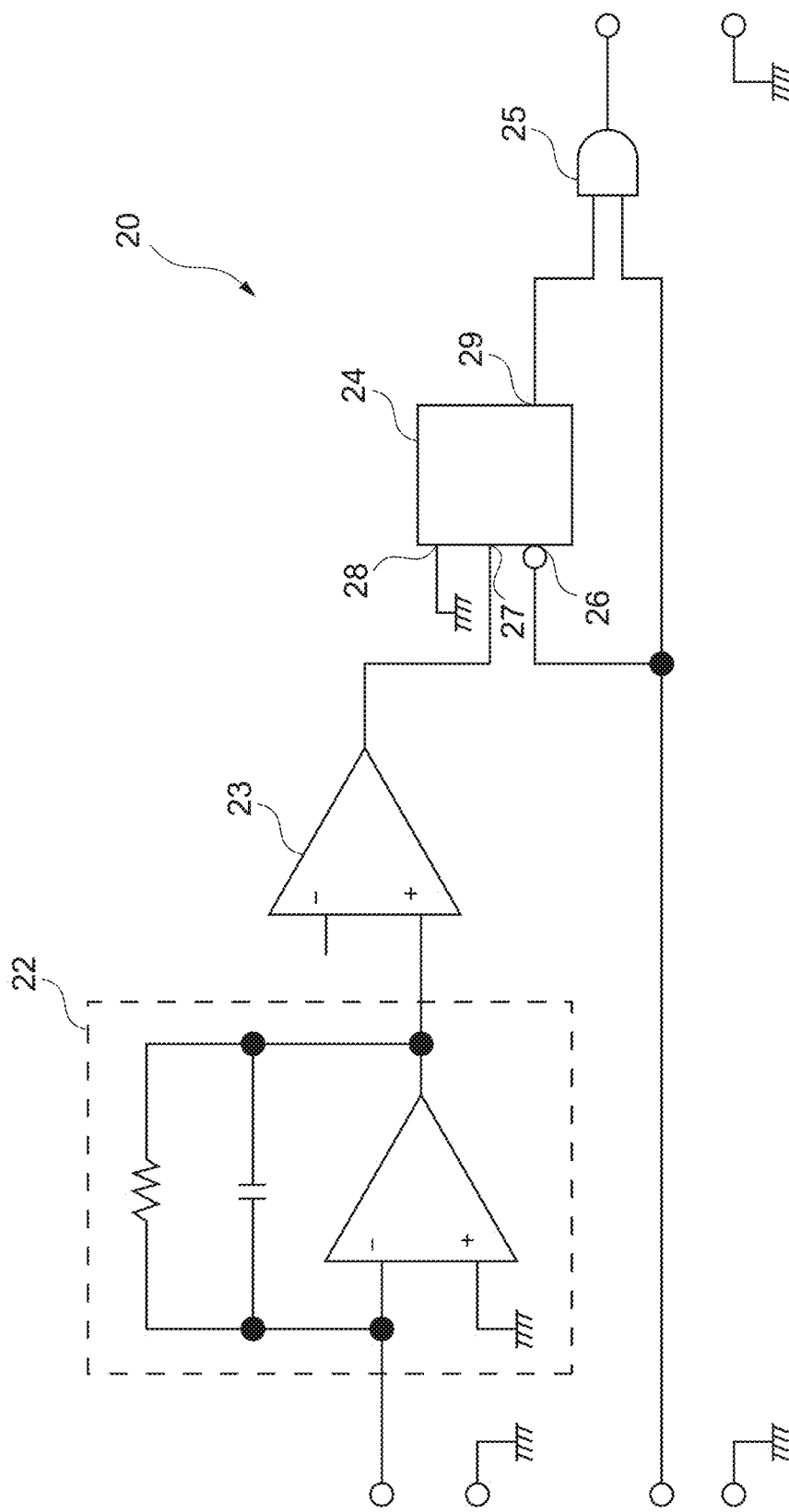
FIG. 5 is a circuit diagram showing an Example of a modulator circuit.

FIG. 5 is a circuit diagram showing an Example of the modulator circuit 20.

The modulator circuit 20 includes a current amplifier 22, a D-type flip-flop with preset 24 (hereinafter, referred to as the flip-flop 24), and an AND gate 25.

When the laser pulse oscillation light 44 is emitted, the laser pulse detection signal 61 corresponding to the laser pulse oscillation light 44 is output as an analog pulse current from the photodetector 60. The output laser pulse detection signal 61 is input to the current amplifier 22.

In the current amplifier 22, the laser pulse detection signal 61 is input as an analog pulse current and is converted into an analog pulse voltage signal. The analog pulse voltage signal output from the current amplifier 22 is input to the comparator 23.

The comparator 23 compared two input signals with each other and switches the signal to be output. In this embodiment, the analog pulse voltage signal input by the comparator 23 is converted into a digital pulse voltage signal, and the obtained signal is input to the flip-flop 24. Note that for inputting a comparison voltage to the comparator 23, a voltage suitable for converting an analog pulse voltage signal into a digital pulse voltage signal is supplied.

The flip-flop 24 includes a preset input terminal 26, a clock input terminal 27, a data input terminal 28, and a data output terminal 29. The flip-flop 24 outputs a held predetermined signal on the basis of the preset input, the clock input, and the data input, which are input to the respective input terminals.

In this embodiment, the pulse signal 11 is input as the preset input. The digital pulse voltage signal converted by the comparator 23 is input as the clock input. An L-signal is input to the data input.

In the flip-flop 24, a predetermined signal is output from the data output terminal 29 on the basis of the signals supplied from the respective input terminals.

The AND gate 25 calculates a logical product of two signals input to the two input terminals. The signal output from the flip-flop 24 is input to one input terminal. The pulse signal 11 output from the signal source 10 is input to the other input terminal.

Further, the AND gate 25 outputs the modulation pulse signal 21 from the input signal.

Figure 6:
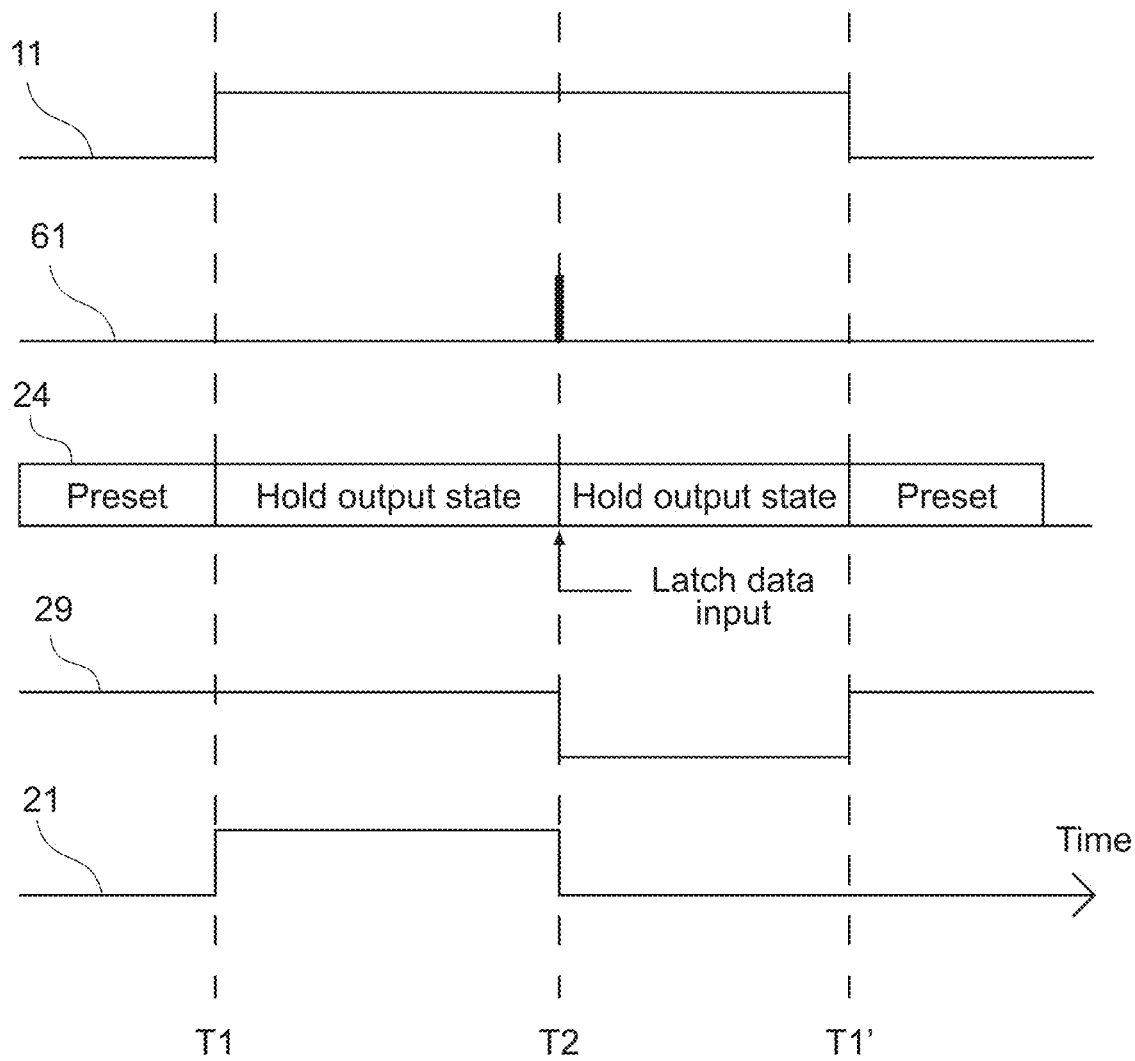
FIG. 6 is a schematic diagram showing the state transition of the signals output from the respective units and an operation mode of a flip-flop.

FIG. 6 is a timing chart showing the state transition of the signals output from the respective units and an operation mode of the flip-flop 24. As shown in FIG. 6, the horizontal axes of the pulse signal 11, the laser pulse detection signal 61, the operation of the flip-flop 24, the signal output from the data output terminal 29 of the flip-flop 24, and the modulation pulse signal 21 represent the time axes indicating the elapsed time of the respective signals. Further, the vertical axis represents the voltage.

FIG. 7 is a diagram showing an operation example of the flip-flop 24.

The pulse signal 11 is input in the L-state as the preset input until the time T1. In this state, the flip-flop 24 performs a preset operation. As shown in FIG. 7, the signal output by the flip-flop 24 is in the H-state regardless of the input states of the clock input terminal 27 and the data input terminal 28.

As shown in FIG. 6, since the pulse signal 11 is in the L-state, the modulation pulse signal 21 in the L-state is output from the AND gate 25.

The pulse signal 11 transitions to the H-state, and the flip-flop 24 performs the operation of holding the output state. In this case, as shown in FIG. 7, the signal output from the flip-flop 24 is kept in the H-state.

Since the pulse signal 11 and the signal output from the flip-flop 24 are both in the H-state, the modulation pulse signal 21 in the H-state is output from the AND gate 25.

At T2, the rising edge of the laser pulse detection signal 61 is detected. That is, the laser pulse detection signal 61 is input to the clock input terminal 27. In this case, an operation of latching (holding) the data input is performed by the flip-flop 24. As a result, as shown in FIG. 7, the potential of the signal output from the flip-flop 24 transitions to the L-state.

Since the pulse signal 11 and the signal output from the flip-flop 24 are in the L-state, the modulation pulse signal 21 in the L-state is output from the AND gate 25.

The pulse signal 11 in the H-state is input to the preset input terminal 26 during the time T2 to T1'. Further, the laser pulse detection signal 61 in the L-state is input to the clock input terminal 27. In this case, the operation of holding the output state is performed by the flip-flop 24. As a result, as shown in FIG. 7, the signal output from the flip-flop 24 is kept in the L-state.

Since the pulse signal 11 and the signal output from the flip-flop 24 are in the L-state, the modulation pulse signal 21 in the L-state is output from the AND gate 25.

The potential of the pulse signal 11 is the L-state at T1' and thereafter. In this case, the flip-flop 24 performs a preset operation. As a result, the signal output from the flip-flop 24 transitions to the H-state. Since the pulse signal 11 is in the L-state, the modulation pulse signal 21 in the L-state is output from the AND gate 25.

That is, the modulator circuit 20 causes the pulse signal output from the signal source to transition to the off-level in accordance with the mission timing of the laser pulse oscillation light 44.

Figure 8:
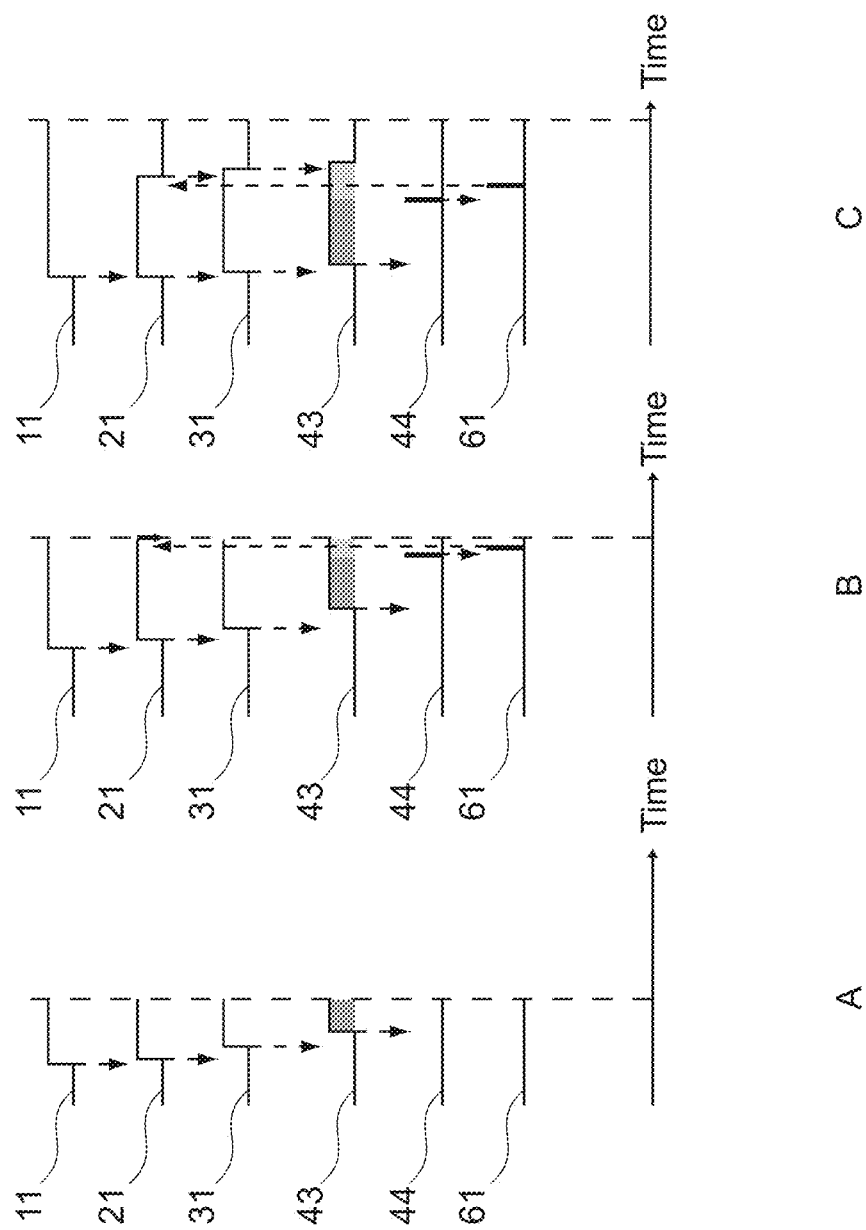
FIG. 8 is a schematic diagram showing the state transition of the signals output from the respective units shown in FIG. 1 and the laser pulse oscillation light.

FIG. 8 is a schematic diagram showing the state transition of the signals output from the respective units in FIG. 1 and the laser pulse oscillation light 44.

Part A of FIG. 8 shows the state where the pulse signal 11 enters the valid state from the invalid state. That is, the state where the laser resonator 42 is excited but the laser pulse oscillation light 44 is not emitted is shown. In this state, the modulation pulse signal 21, the excitation-light-source drive signal 31, and the excitation light 43 enter the valid state from the invalid state in accordance with the on-timing of the pulse signal 11. Note that as shown in Part A of FIG. 8, the deviation of the timing at which the respective signals enter the valid or invalid state is deviation due to response delay.

Part B of FIG. 8 shows the state where the laser pulse oscillation light 44 has been emitted. Since the laser pulse oscillation light 44 has been emitted, the laser pulse detection signal 61 enters the valid state. Further, since the laser pulse detection signal 61 enters the valid state, the modulation pulse signal 21 enters the invalid state. Because of the deviation due to response delay, the emission of the excitation light 43 is continued during the time period corresponding to the deviation. That is, since the excitation light 43 continues to be emitted, excess excitation accumulates in the laser resonator 42.

In this embodiment, the laser pulse detection signal 61 indicating the emission timing at which the laser pulse oscillation light 44 has been emitted is input to the modulator circuit 20. As a result, since the excitation by the excitation light 43 is stopped at the same time as the timing at which the laser pulse oscillation light 44 has been emitted, it is possible to prevent excess excitation from occurring.

However, in the time length in which the influence of response delay of the modulator circuit 20 or the drive power source 30 appears, slight excess excitation is considered to occur because the timing at which the excitation light 43 is stopped is delayed with respect to the timing at which the laser pulse detection signal 61 is output.

Even in this case, in this embodiment, since the interval between a plurality of pulses included in the pulse signal 11, i.e., the pause time (L-level time) included in the pulses, is set to be at least equal to or larger than the minimum pause time, it is possible to prevent excess excitation from affecting the next emission of the laser pulse oscillation light 44.

The minimum pause time represents the time period from the time point at which the excitation has been finished to when the generated excess excitation sufficiently disappears. In this embodiment, the interval between a plurality of pulses is set on the basis of the time difference between the timing at which the laser pulse detection signal 61 is output by the photodetector 60 and the timing at which the excitation light 43 is stopped. For example, in the case where the time difference is long, the interval between the plurality of pulses included in the pulse signal 11 is prolonged. Further, in the case where the time difference is short, the interval between the pulses included in the pulse signal 11 is shortened.

Part C of FIG. 8 shows the state where the emission of the excitation light 43 is stopped and the generation of excess excitation is stopped. While the state where the pulse signal 11 is valid continues, the modulation pulse signal 21 is in the invalid state by the flip-flop 24 and the AND gate 25 described above. Further, the time period in which the excitation light 43 that causes excess excitation to occur is emitted is approximately several ten ns. Meanwhile, the time period in which the excitation light 43 that contributes to the generation of the laser pulse oscillation light 44 is emitted is approximately several ten μs. For this reason, the excess excitation is very small and does not affect the next emission of the laser pulse oscillation light 44.

That is, since the next emission of the laser pulse oscillation light 44 is not affected, the time period from when the modulation pulse signal 21 enters the valid state from the invalid state to when the laser pulse oscillation light 44 is emitted (time period from T1 to T2) is constant regardless of the time length from T2 to T3. This eliminates the necessity to adjust the time period of the on-level of the pulse signal 11.

Figure 9:
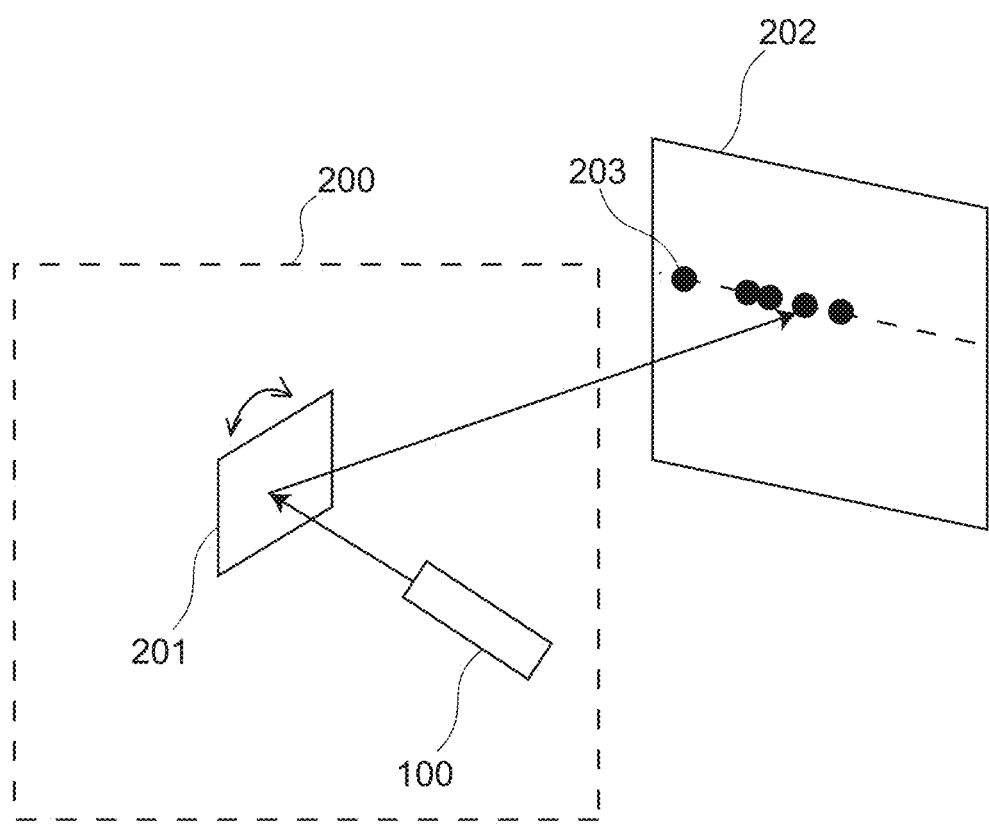
FIG. 9 is a schematic diagram showing an outline of a laser processing device.

FIG. 9 is a schematic diagram showing an outline of a laser processing device 200.

In this embodiment, the laser processing device 200 includes the passive Q switching laser device 100 and a Galvano mirror scanner 201. The laser processing device 200 is used for performing laser processing on a workpiece 202. That is, the laser pulse oscillation light 44 that is transmitted through the beam sampler 50 is emitted to the workpiece 202, thereby performing laser processing.

The Galvano mirror scanner 201 includes a motor that causes a rotation shaft (not shown) to rotate, and an optical mirror attached to the rotation shaft. For example, the motor causes, on the basis of an instruction to control the rotation of the rotation shaft from a computer or the like, the optical mirror to rotate in a predetermined direction. The optical mirror reflects the laser pulse oscillation light 44 such that the laser pulse oscillation light 44 is emitted to a desired processing position 203 of the workpiece 202.

In this embodiment, the Galvano mirror scanner 201 causes the optical mirror to rotate at predetermined angular velocity.

In this embodiment, the Galvano mirror scanner 201 functions as an optical scanning mechanism that performs scanning with the laser pulse oscillation light 44 in order to emit the laser pulse oscillation light 44, which is emitted from the laser resonator 42 of the passive Q switching laser 40, toward the workpiece 202. Further, the Galvano mirror scanner 201 functions as an emission mechanism according to the present technology.

The emission timing of the passive Q switching laser device 100 is set in accordance with the angular velocity of the Galvano mirror scanner 201. As described above, single laser pulse oscillation light 44 is emitted from the passive Q switching laser device 100 while the modulation pulse signal 21 is at the on-level. Further, the time period from when the modulation pulse signal 21 enters the valid state from the invalid state to when the laser pulse oscillation light 44 is emitted is constant regardless of the time period of the on-level of the modulation pulse signal 21.

As a result, even in the case where there is a variation in the operation due to thermal causes of the laser resonator 42, the laser processing device 200 is capable of driving the excitation light source such that the excess excitation is minimized. That is, the laser resonator 42 can be excited under the best conditions, and it is possible to emit the laser pulse oscillation light 44 to the desired processing position 203.

Note that the method of emitting the laser pulse oscillation light 44 toward the desired processing position 203 of the workpiece 202 is not limited. For example, the workpiece 202 may be caused to move by an arbitrary transport mechanism. That is, as an emission mechanism according to the present technology, a transport mechanism that transports the workpiece 202 may be configured.

The specific configurations of the optical scanning mechanism and the transport mechanism are not limited. Further, another arbitrary mechanism different from the optical scanning mechanism and the transport mechanism may be configured as an emission mechanism according to the present technology. It goes without saying that an emission mechanism according to the present technology may be realized by both the optical scanning mechanism and the transport mechanism.

As described above, in the passive Q switching laser device 100 according to this embodiment and the control method for the passive Q switching laser device 100, the pulse signal 11 for driving the excitation light source 41 is output from the signal source 10. The pulse signal 11 is modulated on the basis of the emission timing at which the laser resonator 42 is excited by the excitation light 43 to emit the laser pulse oscillation light 44. The excitation light source 41 is driven on the basis of the modulation pulse signal 21 to emit the excitation light 43. As a result, it is possible to control emission of a laser beam with high accuracy.

In the case where a passive Q switching laser is used for precision processing, laser pulse oscillation light at arbitrary timing is desired. When deviation of the emission timing of the laser pulse oscillation light occurs, the processing position is displaced, which deteriorates the processing quality. That is, there is a need to emit laser pulse oscillation light at arbitrary timing without deviation.

The method of causing a passive Q switching laser to emit laser pulse oscillation light at arbitrary timing include a method of driving an excitation light source at arbitrary timing. However, laser pulse oscillation light cannot be emitted at desired timing due to the influence of excitation state transition in a laser resonator in some cases.

Examples of the causes of deviation of the emission timing of laser pulse oscillation light include excess excitation. There is a time variation in the time period from when a passive Q switch is excited to when laser pulse oscillation light is emitted due to thermal causes of a laser resonator. For this reason, in order to reliably emit laser pulse oscillation light, there is a need to set the time period of the on-level of an excitation-light-source drive signal to be long.

As a method of eliminating the excess excitation, there is a method of lengthening the interval of the pulse signal so that the excess excitation sufficiently disappears. However, the number of laser pulse oscillation lights per unit time is reduced when the interval is lengthened, which is not favorable because the processing efficiency of laser processing is lowered.

In this regard, in the present technology, a drive signal for driving an excitation light source is modulated on the basis of emission timing of oscillation light. The excitation light source is excited on the basis of the modulated drive signal to emit excitation light. This makes it possible to eliminate excess excitation and achieve laser pulse oscillation light at arbitrary timing.

The laser pulse oscillation light 44 at arbitrary timing includes, for example, laser pulse oscillation light that is continuous in a constant period, laser pulse oscillation light that is continuous in a random period, and single laser pulse oscillation light.

The adjustment of emission timing can be performed by adjusting the on-timing at which the pulse signal 11 enters the valid state from the invalid state.

Further, since there is no need to lengthen the interval of the pulse signal 11, it is possible to increase the number of the laser pulse oscillation lights 44 per unit time. As a result, it is possible to improve the processing efficiency of laser processing.

OTHER EMBODIMENTS

The present technology is not limited to the embodiments described above, and can achieve various other embodiments.

In the embodiment descried above, the drive signal has been used as a pulse signal. The present technology is not limited thereto, and the drive signal only needs to be modulated such that the mission of excitation light is stopped in accordance with the emission timing of oscillation light.

In the embodiment described above, the interval between a plurality of pulses is set on the basis of the time difference between the timing at which the laser pulse detection signal 61 is output by the photodetector 60 and the timing at which the laser pulse detection signal 61 is received by the modulator circuit 20. The present technology is not limited thereto, and the interval between a plurality of pulses may be specifically calculated by experiments, simulations, or the like.

In the embodiment described above, the laser pulse oscillation light 44 of the same number as the number of pulses included in the pulse signal 11 has been emitted. The present technology is not limited thereto, and laser pulse oscillation light may be emitted a plurality of times for one pulse.

In the embodiment described above, in order to realize the operation of the passive Q switching laser device 100, the current amplifier 22, the comparator 23, the D-type flip-flop with preset 24, and the AND gate 25 have been used. The present technology is not limited thereto, and a circuit capable of realizing the operation of the passive Q switching laser device 100 may arbitrarily configured.

The field to which the present technology can be applied is not limited. A passive Q switching laser device according to the present technology is applicable to various fields such as manufacturing, processing, beauty, and medical care.

The configuration of the modulator circuit, the laser resonator, the beam sampler, and the like descried with reference to the drawings are merely one embodiment, and modification can be made without departing from the essence of the present technology. That is, other arbitrary configurations and the like for carrying out the present technology may be employed.

Note that the effects described in the present disclosure are merely illustrative and not restrictive, and may have other effects. The description of the plurality of effects described above does not necessarily mean that these effects are exhibited simultaneously. It means that at least one of the effects described above can be achieved in accordance with the condition or the like, and it goes without saying that there is a possibility that an effect that is not described in the present disclosure is exhibited.

Out of the feature parts of each embodiment described above, at least two feature parts can be combined. In other words, various features described in the respective embodiments may be combined discretionarily regardless of the embodiments.

Note that the present technology may also take the following configurations.

(1) A passive Q switching laser device, including:
   a passive Q switching laser that includes an excitation light source that emits excitation light, and a resonator that is excited by the excitation light to emit oscillation light;
   a signal source that outputs a drive signal for driving the excitation light source;

a modulation unit that modulates, on a basis of emission timing at which the oscillation light has been emitted from the passive Q switching laser, the drive signal output from the signal source; and a power source unit that drives, on a basis of the drive signal modulated by the modulation unit, the excitation light source to emit the excitation light.

(2) The passive Q switching laser device according to (1), in which
the modulation unit modulates the drive signal to stop emission of the excitation light in accordance with the emission timing.

(3) The passive Q switching laser device according to (1) or (2), in which
the modulation unit includes a detection unit that detects emission of the oscillation light and outputs a detection signal and a modulator circuit that modulates the drive signal upon receiving the detection signal output from the detection unit.

(4) The passive Q switching laser device according to (3), in which
the detection unit includes a splitting element that partially splits the oscillation light, and a photodetector that receives part of the oscillation light split by the splitting element, converts the received part into a signal, and outputs the converted signal as the detection signal.

(5) The passive Q switching laser device according to any one of (1) to (4), in which
the drive signal is a pulse signal,
the power source unit causes the excitation light source to emit the excitation light while the pulse signal input to the power source unit is at an on-level, and
the modulation unit modulates a time period of the on-level of the pulse signal output from the signal source.

(6) The passive Q switching laser device according to (5), in which
the modulation unit sets the pulse signal output from the signal source in accordance with the emission timing to an off-level.

(7) The passive Q switching laser device according to (5) or (6), in which
the signal source emits the pulse signal in which on-timing has been set on the basis of target timing at which the oscillation light is to be emitted.

(8) The passive Q switching laser device according to any one of (5) to (7), in which
the signal source outputs the pulse signal having pulses corresponding to the desired target number of times of emission of the oscillation light.

(9) The passive Q switching laser device according to any one of (5) to (8), in which
the modulation unit includes a detection unit that detects emission of the oscillation light and outputs a detection signal, and a modulator circuit that modulates the pulse signal upon receiving the detection signal output from the detection unit, and
a pause time of the pulse included in the pulse signal emitted from the signal source is set to be at least equal to or larger than the minimum pause time.

(10) The passive Q switching laser device according to (9), in which
the pause time of the pulse is set on a basis of a time difference between timing at which the detection signal is output from the detection unit and timing at which the excitation light is stopped.

(11) The passive Q switching laser device according to any one of (1) to (10), in which
the excitation light source is a laser diode.

(12) The passive Q switching laser device according to any one of (1) to (11), in which
the detection unit is a photodiode.

(13) A control method for a passive Q switching laser including an excitation light source that emits excitation light and a resonator that is excited by the excitation light to emit oscillation light, including:
outputting a drive signal for driving the excitation light source of the passive Q switching laser;
modulating, on a basis of emission timing at which the oscillation light has been emitted from the resonator of the passive Q switching laser, the drive signal output from the signal source; and
driving, on a basis of the modulated drive signal, the excitation light source to emit the excitation light.

(14) A laser processing device, including:
a passive Q switching laser that includes an excitation light source that emits excitation light, and a resonator that is excited by the excitation light to emit oscillation light;
a signal source that outputs a drive signal for driving the excitation light source;
a modulation unit that modulates, on a basis of emission timing at which the oscillation light has been emitted from the passive Q switching laser, the drive signal output from the signal source;
a power source unit that drives, on a basis of the drive signal modulated by the modulation unit, the excitation light source to emit the excitation light; and
an emission mechanism for emitting, toward a workpiece, the oscillation light emitted from the resonator of the passive Q switching laser.

(15) The laser processing device according to (14), in which
the emission mechanism includes at least one of an optical scanning mechanism that performs scanning with the oscillation light and a transport mechanism that transports the workpiece.

REFERENCE SIGNS LIST

10 signal source
11 pulse signal
20 modulator circuit
21 modulation pulse signal
30 drive power source
40 passive Q switching laser
41 excitation light source
42 laser resonator
43 excitation light
44 laser pulse oscillation light
50 beam sampler
60 photodetector
61 laser pulse detection signal
100 passive Q switching laser device
200 laser processing device

What is claimed is:
1. A passive Q switching laser device, comprising:
a passive Q switching laser that includes an excitation light source that emits excitation light, and a resonator that is excited by the excitation light to emit oscillation light;
a signal source that outputs a drive signal for driving the excitation light source;

a modulation unit that modulates, on a basis of emission timing at which the oscillation light has been emitted from the passive Q switching laser, the drive signal output from the signal source; and a power source unit that drives, on a basis of the drive signal modulated by the modulation unit, the excitation light source to emit the excitation light, wherein the drive signal is a pulse signal, wherein the power source unit causes the excitation light source to emit the excitation light while the drive signal modulated by the modulation unit is at an on-level, and wherein the modulation unit modulates a time period of the on-level of the pulse signal output from the signal source.

2. The passive Q switching laser device according to claim 1, wherein—the modulation unit modulates the drive signal to stop emission of the excitation light in accordance with the emission timing.

3. The passive Q switching laser device according to claim 1, wherein—the modulation unit includes a detection unit that detects emission of the oscillation light and outputs a detection signal and a modulator circuit that modulates the drive signal upon receiving the detection signal output from the detection unit.

4. The passive Q switching laser device according to claim 3, wherein—the detection unit includes a splitting element that partially splits the oscillation light, and a photodetector that receives part of the oscillation light split by the splitting element, converts the received part into a signal, and outputs the converted signal as the detection signal.

5. The passive Q switching laser device according to claim 3, wherein—the detection unit is a photodiode.

6. The passive Q switching laser device according to claim 1, wherein—the modulation unit sets the pulse signal output from the signal source in accordance with the emission timing to an off-level.

7. The passive Q switching laser device according to claim 1, wherein—the signal source emits the pulse signal in which on-timing has been set on the basis of target timing at which the oscillation light is to be emitted.

8. The passive Q switching laser device according to claim 1, wherein—the signal source outputs the pulse signal having pulses corresponding to a desired target number of times of emission of the oscillation light.

9. The passive Q switching laser device according to claim 1, wherein—the modulation unit includes a detection unit that detects emission of the oscillation light and outputs a detection signal, and a modulator circuit that modulates the pulse signal upon receiving the detection signal output from the detection unit, and wherein a pause time of a pulse included in the pulse signal emitted from the signal source is set to be at least equal to or larger than a minimum pause time.

10. The passive Q switching laser device according to claim 9, wherein—the pause time of the pulse is set on a basis of a time difference between timing at which the detection signal is output from the detection unit and timing at which the excitation light is stopped.

11. The passive Q switching laser device according to claim 1, wherein—the excitation light source is a laser diode.

12. A control method for a passive Q switching laser including an excitation light source that emits excitation light and a resonator that is excited by the excitation light to emit oscillation light, comprising:

operating a signal source to output a drive signal for driving the excitation light source of the passive Q switching laser;

operating a modulation unit to modulate, on a basis of emission timing at which the oscillation light has been emitted from the resonator of the passive Q switching laser, the drive signal output from the signal source; and operating a power source unit to drive, on a basis of the modulated drive signal, the excitation light source to emit the excitation light, wherein the drive signal is a pulse signal, wherein the power source unit causes the excitation light source to emit the excitation light while the modulated drive signal is at an on-level, and wherein the modulation unit modulates a time period of the on-level of the pulse signal output from the signal source.

13. A laser processing device, comprising:

a passive Q switching laser that includes an excitation light source that emits excitation light, and a resonator that is excited by the excitation light to emit oscillation light;

a signal source that outputs a drive signal for driving the excitation light source;

a modulation unit that modulates, on a basis of emission timing at which the oscillation light has been emitted from the passive Q switching laser, the drive signal output from the signal source;

a power source unit that drives, on a basis of the drive signal modulated by the modulation unit, the excitation light source to emit the excitation light; and an emission mechanism for emitting, toward a workpiece, the oscillation light emitted from the resonator of the passive Q switching laser, wherein the drive signal is a pulse signal, wherein the power source unit causes the excitation light source to emit the excitation light while the drive signal modulated by the modulation unit is at an on-level, and wherein the modulation unit modulates a time period of the on-level of the pulse signal output from the signal source.

14. The laser processing device according to claim 13, wherein—the emission mechanism includes at least one of an optical scanning mechanism that performs scanning with the oscillation light and a transport mechanism that transports the workpiece.

15. The laser processing device according to claim 13, wherein the modulation unit modulates the drive signal to stop emission of the excitation light in accordance with the emission timing.

16. The laser processing device according to claim 13, wherein the modulation unit includes a detection unit that detects emission of the oscillation light and outputs a detection signal and a modulator circuit that modulates the drive signal upon receiving the detection signal output from the detection unit.

17. The laser processing device according to claim 16, wherein the detection unit includes a splitting element that partially splits the oscillation light, and a photodetector that receives part of the oscillation light split by the splitting element, converts the received part into a signal, and outputs the converted signal as the detection signal.

18. The laser processing device according to claim 13, wherein the modulation unit sets the pulse signal output from the signal source in accordance with the emission timing to an off-level.

19. The laser processing device according to claim 13, wherein the signal source emits the pulse signal in which on-timing has been set on the basis of target timing at which the oscillation light is to be emitted.

20. The laser processing device according to claim 13, wherein the signal source outputs the pulse signal having pulses corresponding to a desired target number of times of emission of the oscillation light.

* * * * *